(12) United States Patent
Oh

(10) Patent No.: US 8,049,546 B2
(45) Date of Patent: Nov. 1, 2011

(54) FLIP-FLOP, FREQUENCY DIVIDER AND RF CIRCUIT HAVING THE SAME

(75) Inventor: Hyoung-seok Oh, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/028,487

(22) Filed: Feb. 16, 2011

(65) Prior Publication Data

US 2011/0181330 A1    Jul. 28, 2011

Related U.S. Application Data

(62) Division of application No. 12/400,948, filed on Mar. 10, 2009, now Pat. No. 7,973,574.

(30) Foreign Application Priority Data

Mar. 11, 2008   (KR) .................. 10-2008-0022593

(51) Int. Cl.
*H03K 3/12*     (2006.01)
(52) U.S. Cl. ...................................... 327/219; 327/199

(58) Field of Classification Search ............... 327/199, 327/200, 201, 208, 210, 211, 212, 214, 215, 327/218, 219, 222
See application file for complete search history.

(56) References Cited

U.S. PATENT DOCUMENTS

| | | | | |
|---|---|---|---|---|
| 5,999,022 A | * | 12/1999 | Iwata et al. | 327/112 |
| 6,369,630 B1 | * | 4/2002 | Rockett | 327/210 |
| 7,304,519 B2 | * | 12/2007 | Neubauer | 327/203 |

FOREIGN PATENT DOCUMENTS

| | | |
|---|---|---|
| JP | 2005-287001 | 10/2005 |
| KR | 20060067189 | 6/2006 |
| KR | 20070061243 | 6/2007 |

* cited by examiner

*Primary Examiner* — Jeffrey Zweizig
(74) *Attorney, Agent, or Firm* — Stanzione & Kim, LLP

(57) ABSTRACT

A flip-flop, and a frequency divider and an RF circuit using the flip-flop. The frequency divider, which receives a first signal and generates a second signal by dividing a frequency of the first signal, including a plurality of flip-flops that each latch and output a signal based on the first signal; and at least one switch unit that is switched in response to a control signal to modify a signal transfer path between the plurality of the flip-flops, wherein a different number of flip-flops are activated in response to each first and second status of the control signal so that the frequency of the first signal is divided by different multiples.

4 Claims, 10 Drawing Sheets

US 8,049,546 B2

FLIP-FLOP, FREQUENCY DIVIDER AND RF CIRCUIT HAVING THE SAME

CROSS-REFERENCE TO RELATED APPLICATIONS

This application is a Divisional Application of U.S. patent application Ser. No. 12/400,948, filed on Mar. 10, 2009 now U.S. Pat. No. 7,973,574 in the U.S. Patent and Trademark Office, which claims priority under 35 U.S.C. §119 from Korean Patent Application No. 10-2008-0022593, filed on Mar. 11, 2008, in the Korean Intellectual Property Office, the disclosure of which is incorporated herein in its entirety by reference.

BACKGROUND

1. Field of the General Inventive Concept

The present general inventive concept relates to a flip-flop, a frequency divider, and a radio frequency (RF) circuit, and more particularly, to a flip-flop, a frequency divider, and a radio frequency (RF) circuit that support a multi-band signal.

2. Description of the Related Art

In general, a wireless communication system includes a digital or analog baseband circuit that processes information such as actual voice sound, audio data, video data, etc., and radio frequency (RF) circuit processing signals that are transmitted and received with high frequency. As is well known in the art, the baseband circuit and the RF circuit may be separately realized using chips, respectively, wherein the RF circuit converts baseband signals provided by the baseband circuit into high frequency RF signals. A conventional RF circuit to support a multi-band signal will be described with respect to FIGS. 1 and 2.

FIG. 1 is a block diagram illustrating an example of a conventional RF circuit 10. As illustrated in FIG. 1, the conventional RF circuit 10 requires various RF dividers to support a multi-band signal.

The conventional RF circuit 10 of FIG. 1 receives a baseband signal B/B Sig generated in a baseband circuit (not illustrated) and converts the baseband signal B/B Sig to a high frequency RF signal. The conventional RF signal 10 includes a phase locked loop (PLL) 11 that receives a reference clock signal CLK and outputs an oscillation signal $f_o$, which may be a high frequency oscillation signal, and at least one frequency divider. The at least one frequency divider may be a first frequency divider 12 and a second frequency divider 13 which are serially connected to each other. For example, the first frequency divider 12 and the second frequency divider 13 may respectively be divide-by-two frequency dividers that divide a frequency of an input signal by two and output the signal with the divided frequency. Also, the conventional RF circuit 10 may include a first drive circuit 14 generating a low band signal LB to support the frequency band of about 800-900 MHz and a second drive circuit 15 generating a high band signal HB to support the frequency band of about 1700-1900 MHz.

In the conventional RF circuit 10 of FIG. 1, the oscillation signal $f_o$ passes through the first frequency divider 12 and the second frequency divider 13 which are serially connected to each other, and thus the frequency of the oscillation signal $f_o$ is converted to $f_o/2$ or $f_o/4$. The oscillation signal having its frequency converted to $f_o/4$ is provided to the first drive circuit 14 to generate a low band signal LB, and the oscillation signal having its frequency converted to $f_o/2$ is provided to the second drive circuit 15 to generate a high band signal HB. The first drive circuit 14 generates the low band signal LB by mixing the oscillation signal having its frequency converted to $f_o/4$ with a baseband signal B/B Sig. Also, the second drive circuit 15 generates the high band signal HB by mixing the oscillation signal having its frequency converted to $f_o/2$ with a baseband signal B/B Sig.

The conventional RF circuit 10 generates a $f_o/2$ frequency signal and a $f_o/4$ frequency signal using two divide-by-two frequency dividers that may be generally realized using two flip-flops. That is, only two divide-by-two frequency dividers that are serially connected to each other are included in the conventional RF circuit 10, and thus the number of flip-flops is reduced accordingly, and the surface area of chips can be reduced and the load capacitance at the output of the PLL 11 can be reduced. However, when generating a frequency signal $f_o/4$, to generate a low band signal, division processes are performed twice by the divide-by-two frequency dividers, and thus out-band phase noise is decreased compared to a case where only one division process is performed using a divide-by-four frequency divider.

In general, a close-in phase noise of an operational frequency of a frequency divider is very small compared to an oscillation signal $f_o$, and thus noise caused by the frequency divider may be neglected. However, it is difficult to maintain out-band phase noise, which is far away from the operational frequency, to be smaller than the phase noise of the oscillation signal $f_o$. Accordingly, the out-band phase noise needs to be maintained small in order to support a multi-band signal.

FIG. 2 is a block diagram illustrating another conventional RF circuit 20. As illustrated in FIG. 2, the conventional RF circuit 20 includes a PLL 21 outputting an oscillation signal $f_o$, which may be a high frequency oscillation signal, and at least one frequency divider. The at least one frequency divider may be a first frequency divider 22 and a second frequency divider 23 that are connected parallel to each other. For example, the first frequency divider 22 may be a divide-by-four frequency divider that divides a frequency of an input signal by four and outputs the signal with the divided frequency, and the second frequency divider 23 may be a divide-by-two frequency divider that divides a frequency of an input signal by two and outputs the signal with the divided frequency. Also, the conventional RF circuit 20 may include a first drive circuit 24 generating a low band signal LB and a second drive circuit 25 generating a high band signal HB.

As illustrated in FIG. 2, the first frequency divider 22 receives an oscillation signal $f_o$ and converts its frequency to $f_o/4$, and provides the oscillation signal having its frequency converted to $f_o/4$ to the first drive circuit 24. Also, the second frequency divider 23 receives an oscillation signal $f_o$ and converts its frequency to $f_o/2$, and provides the oscillation signal having its frequency converted to $f_o/2$ to the second drive circuit 25. The first drive circuit 24 mixes the oscillation signal having its frequency converted to $f_o/4$ with a baseband signal B/B Sig to generate a low band signal LB. Also, the second drive circuit 25 mixes the oscillation signal having its frequency converted to $f_o/2$ with a baseband signal B/B Sig to generate a high band signal HB.

The conventional RF circuit 20 of FIG. 2 generates a $f_o/2$ frequency signal and a $f_o/4$ frequency signal using a divide-by-two frequency divider and a divide-by-four frequency divider that may be generally realized using two flip-flops, respectively. Unlike in FIG. 1, the conventional RF circuit 20 uses individual frequency dividers for each band, and thus the out-band phase noise can be reduced. Also, in the conventional RF circuit 20, the divide-by-four frequency divider is activated to generate the low band signal LB and operates at a frequency $f_o/4$, and thus the power consumption can be reduced compared to when the first frequency divider 12 of FIG. 1 operates at a frequency $f_o/2$.

However, the divide-by-four frequency divider is generally realized using four flip-flops, and thus the number of flip-flops is increased compared to the case of FIG. 1, which is disadvantageous in terms of reducing the surface area of the chips. Also, in terms of the output of the PLL 11, two frequency dividers are arranged parallel and thus the load capacitance is increased.

SUMMARY

The present general inventive concept provides a flip-flop with which the surface area of chips and power consumption can be reduced and the out-band phase noise can be efficiently reduced, a frequency divider and an RF circuit using the flip-flop.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a frequency divider, which receives a first signal and generates a second signal by dividing a frequency of the first signal, including a plurality of flip-flops that each performs an operation of latching and outputting an input signal based on the first signal; and at least one switch unit that is switched in response to a control signal to modify a signal transfer path between the plurality of the flip-flops, wherein different numbers of flip-flops are activated in response to one of first and second statuses of the control signal so that the frequency of the first signal is divided by different multiples.

When the control signal is in the first status, all of the plurality of the flip-flops may be activated to divide the frequency of the first signal by a large multiple, and when the control signal is in a second status, a portion of the plurality of the flip-flops may be activated to divide the frequency of the first signal by a small multiple.

The plurality of the flip-flops may include first through fourth flip-flops that are connected to one another, and the first through fourth flip-flops may be electrically connected to one another in response to the first status of the control signal to divide the frequency of the first signal by four and output the frequency-divided first signal, and two of the first through fourth flip-flops may be electrically connected to each other in response to the second status of the control signal to divide the frequency of the first signal by two and output the frequency-divided first signal. The plurality of first through fourth flip-flops may be serially connected to one another.

Also, the at least one switch unit may include a first switch unit connecting an output of the first flip-flop with an input of the second flip-flop; a second switch unit connecting an output of the third flip-flop with an input of the fourth flip-flop; and a third switch unit connecting an output of the first flip-flop with an input of the fourth flip-flop.

When the first switch unit and the second switch unit are turned on in response to the first status of the control signal, the first through fourth flip-flops may be activated to divide the frequency of the first signal by four and output the frequency-divided first signal, and when the third switch unit is turned on in response to the second status of the control signal, the first flip-flop and the fourth flip-flop may be activated to divide the frequency of the first signal by two and output the frequency-divided first signal.

The foregoing and/or other aspects and utilities of the present general inventive concept may also be achieved by providing a radio frequency (RF) circuit that supports a multi-band signal, wherein the RF circuit includes a frequency divider which receives a first signal with a high frequency and includes a plurality of flip-flops, wherein each of the plurality of the flip flops latches and inputs a signal based on the received first signal; and at least one switch unit to modify signal transfer paths between the flip-flops, wherein a different number of flip-flops are activated according to the status of an input control signal to divide the frequency of the first signal by different multiples and output the frequency-divided first signal; and a drive circuit that mixes the frequency-divided signal output from the frequency divider with a baseband signal to generate an RF signal.

A control signal generating unit may generate the control signal to control the at least one switch unit. The frequency divider may be configured to divide the frequency of the first signal with a large multiple by activating all of the plurality of flip-flops when the control signal is in a first status, and the frequency divider is configured to divide the frequency of the first signal with a small multiple by activating some of the plurality of flip-flops when the control signal is in a second status.

The frequency divider may include first through fourth flip-flops serially connected to one another, a first switch unit connecting an output of the first flip-flop with an input of the second flip-flop, a second switch unit connecting an output of the third flip-flop with an input of the fourth flip-flop, and a third switch unit connecting the output of the first flip-flop with the input of the fourth flip-flop. The frequency divider may be configured to divide the frequency of the first signal by four by activating the first through fourth flip-flops when the first switch unit and second switch unit are turned on in response to the first status of the control signal, and the frequency divider is configured to divide the frequency of the first signal by two by activation the first flip-flop and the fourth flip-flop when the third switch unit is turned on in response to the second status of the control signal. The drive circuit may include a first drive circuit generating a low band signal by mixing the first signal divided by four with the baseband signal, and a second drive circuit generating a high band signal by mixing the first signal divided by two with the baseband signal.

The drive circuit may mix the first signal that is frequency-divided by a large multiple with the baseband signal to generate a low band signal, and may mix the first signal that is frequency-divided by a small multiple with the baseband signal to generate a high band signal. The RF circuit may include a phase locked loop (PLL) to generate the first signal with the high frequency. The PLL may receive a phase modulated (PM) baseband signal to generate the first signal with the high frequency, and the drive circuit may mix the frequency-divided first signal with an amplitude-modulated (AM) baseband signal. The PLL may receive a reference clock signal to generate the first signal, and the drive circuit may mix the frequency-divided first signal with at least one of a phase and amplitude modulated baseband signal.

The foregoing and/or other aspects and utilities of the present general inventive concept may also be achieved by providing a flip-flop applied in a frequency divider including a latch unit latching an input signal; at least one inverter receiving and inverting an output of the latch unit; a switch unit switching a voltage signal provided to the latch unit and the at least one inverter; and a resistor unit connected to an output end of the at least one inverter and supplying a bias voltage to the output end of the at least one inverter. The switch unit may include a first switch unit supplying a power voltage to the latch unit and the at least one inverter, and a second switch unit grounding the latch unit and the at least one inverter with the ground voltage. The resistor may include a first resistor unit comprising a plurality of resistors that are serially connected between a first clock signal supplied to the first switch unit and a second clock signal supplied to the second switch unit, and a second resistor unit comprising a plurality of resistors that are serially connected between an output end of a first inverter and an output end of a second inverter, wherein the first and second inverters are included in the at least one inverter. The resistor unit may supply a bias voltage having half the amplitude of the power voltage to the output end of the first inverter and the output end of the second inverter.

The foregoing and/or other aspects and utilities of the present general inventive concept may also be achieved by providing a method of using a radio frequency (RF) circuit that supports a multi-band signal, including receiving a first signal with a high frequency using a plurality of flip-flops, wherein each of the plurality of flip flops latches and inputs a signal based on the received first signal, modifying signal transfer paths between the flip-flops, wherein a different number of flip-flops are activated according to the status of an input control signal to divide the frequency of the first signal by different multiples and output the frequency-divided first signal, and mixing the frequency-divided first signal output from the frequency divider with a baseband signal to generate an RF signal. The method may also include generating the control signal to control the at least one switch unit.

The method may also include dividing the frequency of the first signal with a large multiple by activating all of the plurality of flip-flops when the control signal is in a first status, and dividing the frequency of the first signal with a small multiple by activating some of the plurality of flip-flops when the control signal is in a second status.

The foregoing and/or other aspects and utilities of the present general inventive concept may also be achieved by providing a variable frequency divider circuit that may input an oscillating signal and may output a divided-by-four signal to generate a low band signal using not more than four flip-flops and outputs a divided-by-two signal to generate a high band signal using not more than two flip-flops.

The foregoing and/or other aspects and utilities of the present general inventive concept may also be achieved by providing a variable frequency divider circuit, including first, second, third and fourth flip-flops arrayed sequentially and serially such that an output signal generated at an output end and an inversed output end of the fourth flip-flop is fed back into an input end and an inversed input end of the first flip flop.

The foregoing and/or other aspects and utilities of the present general inventive concept may also be achieved by providing a variable frequency divider circuit, including first, second, and third switch units, first, second, third, and fourth flip-flops, and a control unit to set a status of a control signal, wherein the first, second, and third switch units may be respectively controlled according to the status of the control signal such that signal transfer paths between the first, second, third, and fourth flip-flops may be varied. When the first and second switches are turned on, the third switch may be turned off.

The foregoing and/or other aspects and utilities of the present general inventive concept may also be achieved by providing a variable frequency divider apparatus including a variable frequency divider having a plurality of flip-flop circuits to selectively form a first combination of the plurality of flip-flop circuits to generate a first output frequency signal from an input frequency signal, and to selectively form a second combination of the plurality of flip-flop circuits to generate a second output frequency signal from the input frequency signal.

The variable frequency divider apparatus may include a clock generator to generate the input frequency signal. The first combination of the plurality of flip-flops may generates a first output frequency signal divided by four. The second combination of the plurality of flip-flops generates a second output frequency divided by two.

BRIEF DESCRIPTION OF THE DRAWINGS

Exemplary embodiments of the present general inventive concept will be more clearly understood from the following detailed description taken in conjunction with the accompanying drawings in which.

DETAILED DESCRIPTION OF THE EMBODIMENTS

Figure 1:
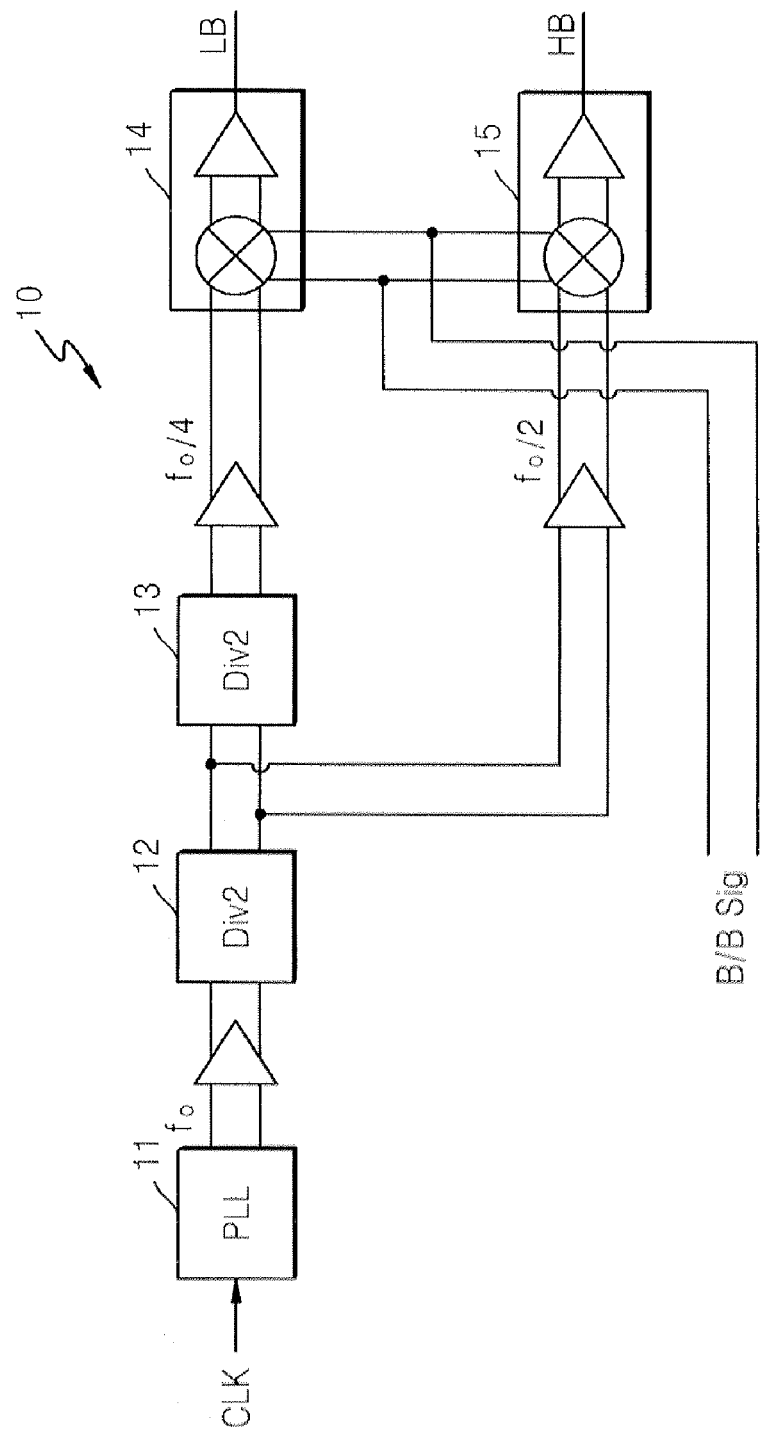
FIG. 1 is a block diagram illustrating a conventional radio frequency (RF) circuit.
Figure 2:
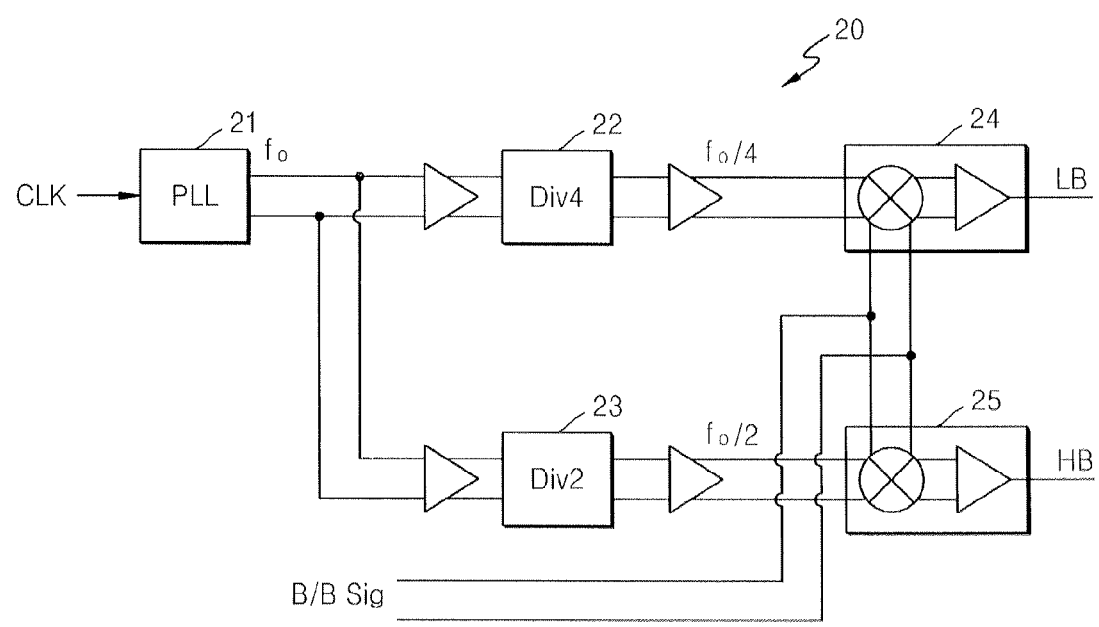
FIG. 2 is a block diagram illustrating another conventional RF circuit.

The attached drawings illustrate exemplary embodiments of the present general inventive concept and are referred to in order to gain a sufficient understanding of the present general inventive concept, the merits thereof, and the objectives accomplished by the implementation of the present general inventive concept.

Hereinafter, the present general inventive concept will be described in detail by explaining exemplary embodiments of the present general inventive concept with reference to the attached drawings. Like reference numerals in the drawings denote like elements.

Figure 3:
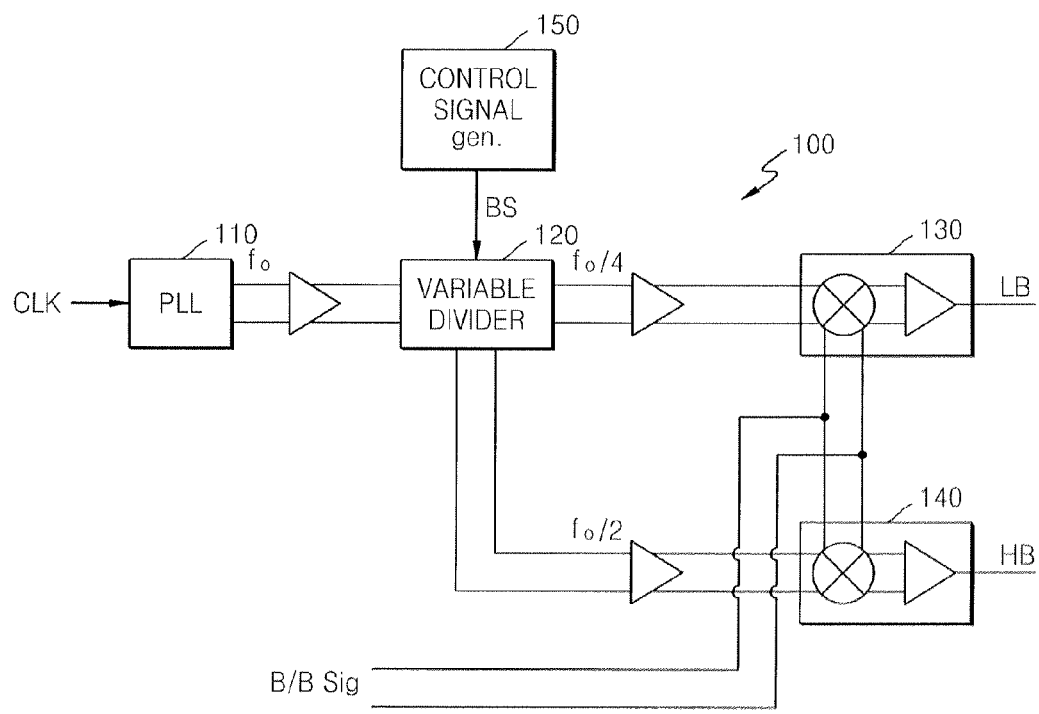
FIG. 3 is a block diagram illustrating an RF circuit according to an embodiment of the present general inventive concept.

FIG. 3 is a block diagram illustrating a radio frequency (RF) circuit 100 according to an embodiment of the present general inventive concept. The RF circuit 100 converts a baseband signal B/B Sig provided by a baseband circuit (not illustrated) into a high frequency RF signal, and may include a variable frequency divider 120 that divides a frequency of an input signal by different multiples according to various bands and outputs the frequency-divided signal to support a multi-band signal.

As illustrated in FIG. 3, the RF circuit 100 may include a phase locked loop (PLL) 110, the variable frequency divider 120, and a control signal generating unit 150 generating a control signal BS to control the variable frequency divider 120. The variable frequency divider 120 may receive an oscillation signal $f_o$ via a buffer as the input signal, and divides the frequency of the received oscillation signal $f_o$ by different multiples according to the status of the control signal BS. For example, the variable frequency divider 120 may generate a divided-by-four signal $f_o/4$, from the received oscillation signal $f_o$ whereafter its frequency is divided by four in response to a first status of the control signal BS in order to support a low band signal LB. Also, the variable frequency divider 120 may generate a divided-by-two signal $f_o/2$ from the received oscillation signal $f_o$ in response to a second status of the control signal BS in order to support a high band signal HB.

Meanwhile, the RF circuit 100 may further include a drive circuit that receives a frequency-divided signal provided by the variable frequency divider 120 to generate an RF signal. For example, the RF circuit 100 may include a first drive circuit 130 that mixes a frequency-divided signal $f_o/4$ provided by the variable frequency divider 120 with the baseband B/B Sig and outputs a mixed signal to support a low band LB signal. And the RF circuit 100 may further include a second drive circuit 140 that mixes a frequency-divided signal $f_o/2$ provided by the variable frequency divider 120 with the baseband B/B Sig and outputs a mixed signal to support a high band HB signal.

As illustrated in FIG. 3, in order to support a low frequency band, for example of about 800-900 MHz, the first drive circuit 130 receives a divided-by-four signal $f_o/4$ and mixes the divided-by-four signal $f_o/4$ with a baseband signal B/B Sig to output a low band signal. Also, in order to support a high frequency band, for example of about 1700-1900 MHz, the second drive circuit 130 receives a divided-by-two signal $f_o/2$ and mixes the divided-by-two signal with a baseband signal B/B Sig to output a high band signal. An RF circuit can be designed so that various frequency bands are supported by adjusting the frequency of the oscillation signal $f_o$ output from the PLL 110 or dividing the frequency of the received oscillation signal of the PLL 110 with the variable frequency divider 120. Also, a drive circuit to output a low band signal and a drive circuit to output a high band signal are separated from each other as illustrated in FIG. 3. An embodiment of the present general inventive concept may include one drive circuit that is modified to selectively output a low band signal and a high band signal.

The variable frequency divider 120 may include a plurality of flip-flops (not illustrated). The oscillation signal $f_o$ can be frequency-divided and output by serially connecting the flip-flops. In general, n flip-flops are required in a frequency divider to divide the frequency of an input signal by n. According to the current embodiment of the present general inventive concept, the variable frequency divider 120 further includes at least one switch unit besides the flip-flops, and the at least one switch unit is switched by a control signal BS or an inversed control signal $\overline{BS}$. According to the switching operation, signal transfer paths between the flip-flops vary, and thus the number of flip-flops that are activated inside the variable frequency divider 120 also varies. When many flip-flops are activated, the frequency of the input signals are divided by a large multiple and then output. On the other hand, when few flip-flops are activated, the frequency of the input signals are divided by a small multiple and then output. The operation of the variable frequency divider 120 will be described in detail with reference to FIG. 4 below.

Figure 4:
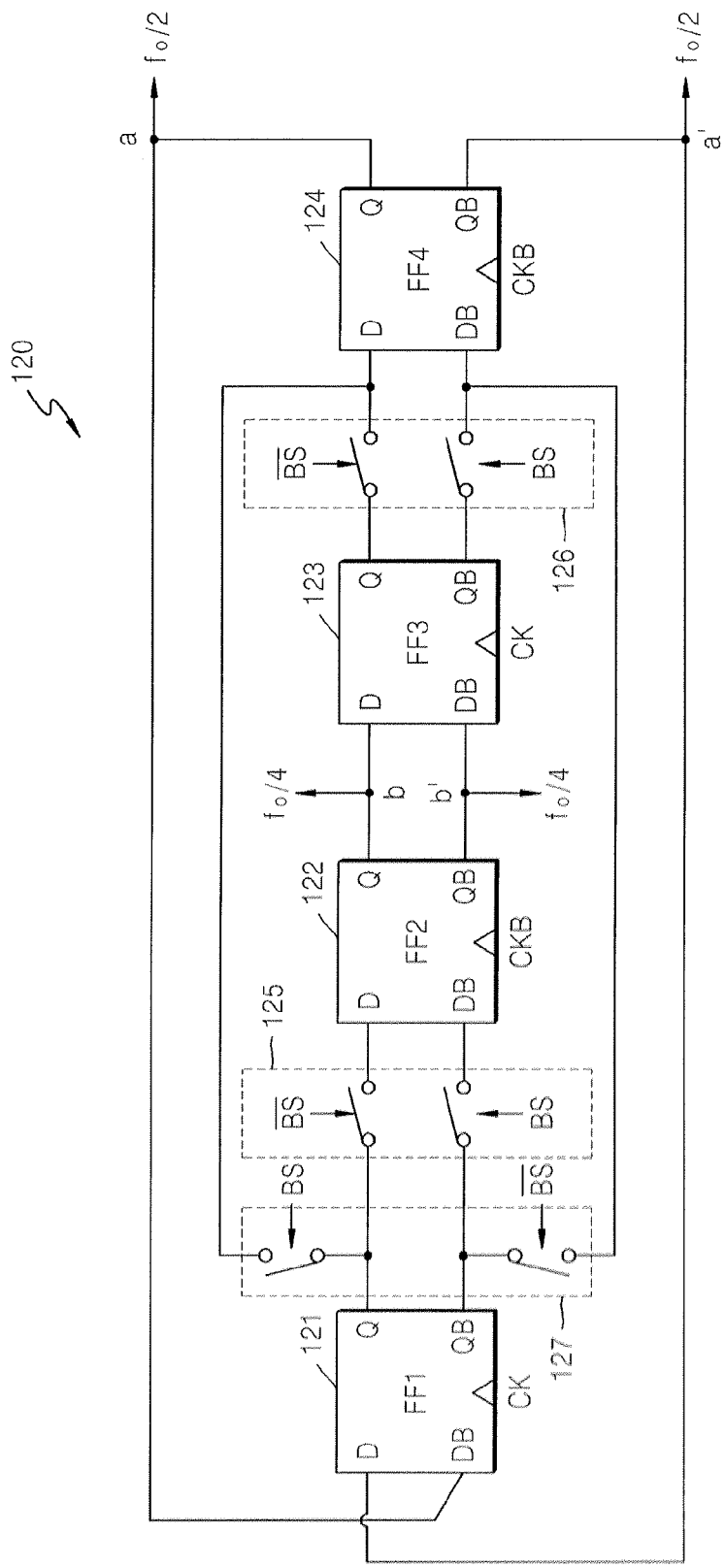
FIG. 4 is a circuit diagram illustrating a variable frequency divider illustrated in FIG. 3 according to an embodiment of the present general inventive concept.

FIG. 4 is a circuit diagram illustrating the variable frequency divider 120 illustrated in FIG. 3. As illustrated in FIG. 4, the variable frequency divider 120 may include a plurality of flip-flops and at least one switch unit. For example, as illustrated in FIG. 3, in the case that the oscillation signal $f_o$ may be divided by four in order to generate a low band LB signal and the oscillation signal $f_o$ may be divided by two in order to generate a high band HB signal, the variable frequency divider 120 may include first through fourth flip-flops 121, 122, 123, and 124 that are serially connected to one another, and first through third switch units 125, 126, and 127 to modify the signal transfer paths between the first through fourth flip-flops 121, 122, 123, and 124.

The first through fourth flip-flops 121, 122, 123, and 124 respectively latch signals input through input ends D and inversed input ends DB based on clock signals CK or inversed clock signals CKB and then output the latched signals. When the variable frequency divider 120 receives an oscillation signal $f_o$ generated in the PLL 110 and divides the oscillation signal $f_o$, the oscillation signal $f_o$ may be provided as a clock signal CK to clock ends of the first through fourth flip-flops 121, 122, 123, and 124. An output end Q and an inversed output end QB of the first flip-flop 121 may be connected to the input end D and the inversed input end DB of the second flip-flop 122, and an output end Q and an inversed output end QB of the second flip-flop 122 may be connected to the input end D and the inversed input end DB of the third flip-flop 123. Also, an output end Q and an inversed output end QB of the third flip-flop 123 may be connected to the input end D and the inversed input end DB of the fourth flip-flop 124. An output signal generated in an output end Q and an inversed output end QB of the fourth flip-flop 124 may be fed back to the input end D and the inversed input end DB of the first flip-flop 121.

Meanwhile, as the first through third switch units 125, 126, and 127 are respectively controlled according to the status of the control signal BS, the signal transfer paths between the first through fourth flip-flops 121, 122, 123, and 124 may vary. For example, the first switch unit 125 may be connected between the output end Q and the inversed output end QB of the first flip-flop 121 and the input end D and the inversed input end DB of the second flip-flop 122. Also, the second switch unit 126 may be connected between the output end Q and the inversed output end QB of the third flip-flop 123 and the input end D and the inversed input end DB of the fourth flip-flop 124. Also, the third switch unit 127 may be connected between the output end Q and the inversed output end QB of the first flip-flop 121 and the input end D and the inversed input end DB of the fourth flip-flop 124.

Figure 9:
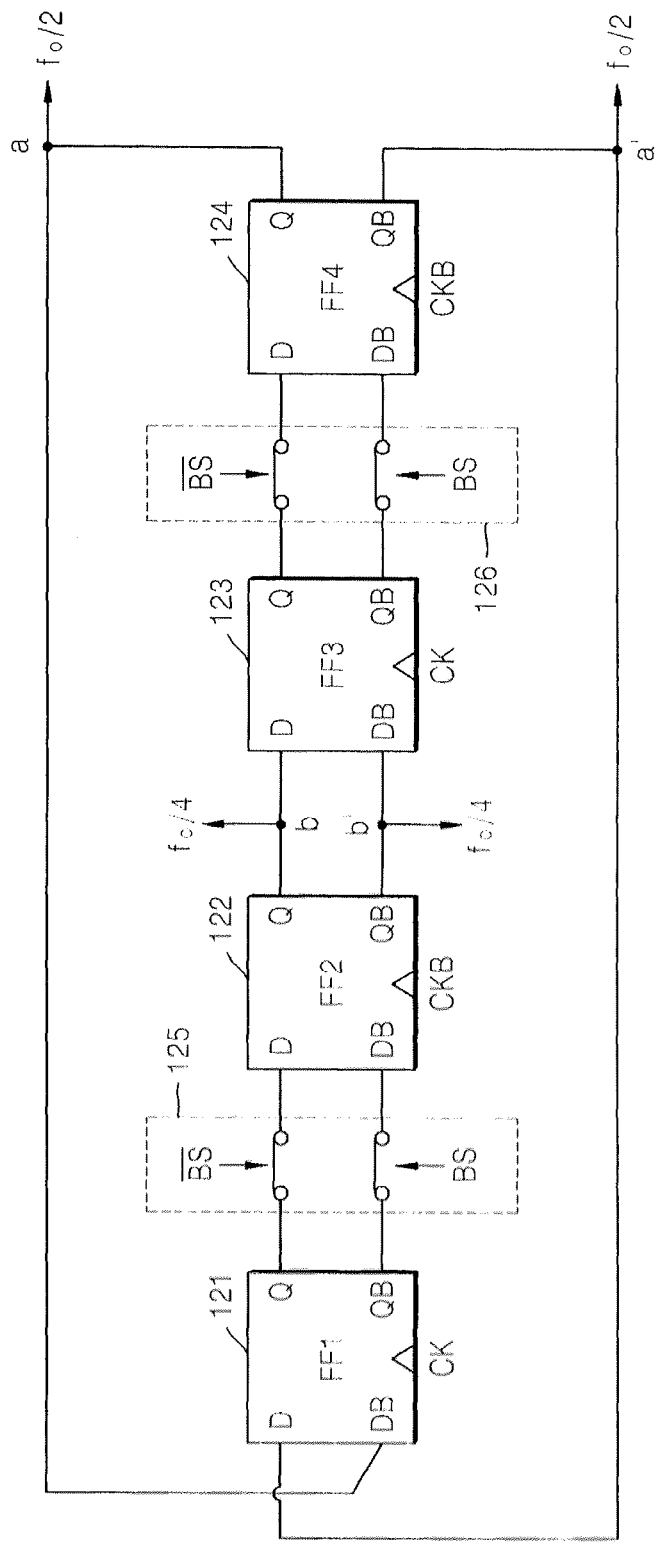
FIG. 9 is a circuit diagram illustrating the flip-flop circuit of FIG. 4 according to an embodiment of the present general inventive concept.

Also, the number of flip-flops that are activated in the variable frequency divider 120 varies according to the switching operation of the first through third switch units 125, 126, and 127, and accordingly, the variable frequency divider 120 outputs signals that are frequency-divided by different multiples. For example, when the control signal BS is in a first status, for example, at a low level, the first switch unit 125 and the second switch unit 126 are turned on, and the third switch unit 127 is turned off. According to the switching operation, all of the first through fourth flip-flops 121, 122, 123, and 124 are activated, and signal transfer paths are through the first through fourth flip-flops 121, 122, 123, and 124 as illustrated in FIG. 9. Accordingly, an oscillation signal $f_o$ provided to the variable frequency divider 120 is divided by four and then output through a node b, b' that is between the output end Q and the inversed output end QB of the second flip-flop 122 and the input end D and the inversed input end DB of the third flip-flop 123. However, the output is not limited to the node b, b', and the divided-by-four signal may also be output through other nodes such as a node a, a' positioned between the output end Q and the inversed output end QB of the fourth flip-flop 124.

Figure 10:
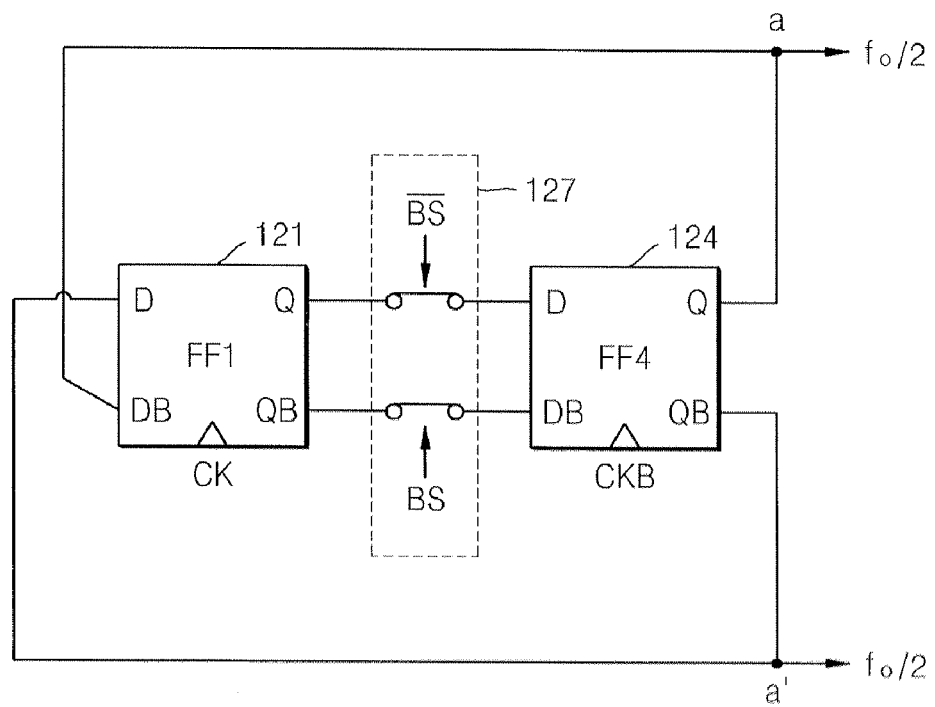
FIG. 10 is a circuit diagram illustration the flip-flop circuit of FIG. 4 according to an embodiment of the present general inventive concept.

Meanwhile, when the control signal BS is in a second status, for example, at a high level, the third switch unit 127 is turned on, and the first switch unit 125 and the second switch unit 126 are turned off. Accordingly, the output end Q and the inversed output end QB of the first flip-flop 121 are electrically connected to the input end D and the inversed input end DB of the fourth flip-flop 124, and thus only the first flip-flop 121 and the fourth flip-flop 124 are activated, as illustrated in FIG. 10. On the other hand, as the signal transmission to the input ends D and the inversed input ends DB of the second flip-flop 122 and the third flip-flop 123 is blocked, the second flip-flop 122 and the third flip-flop 123 are deactivated. Also, since only two flip-flops are activated in the variable frequency divider 120, an oscillation signal $f_o$ provided to the variable frequency divider 120 is frequency-divided by two and then output preferably through the node a, a'.

According to the RF circuit 100 and the variable frequency divider 120 illustrated in FIGS. 3 and 4, both a divided-by-four signal to generate a low band signal and a divided-by-two signal to generate a high band signal can be generated using only four flip-flops, and thus the overall circuit size can be reduced. That is, although one or more switching units, which may not be illustrated to scale, are included in the variable frequency divider 120, adjacent the flip-flops, and since a switch unit has a sufficiently smaller size compared to a flip-flop, it is possible to reduce the overall circuit size. Also, at the output of the PLL 110, only one frequency divider can be arranged, and thus the load capacitance can be reduced.

Also, when outputting a divided-by-four signal, since all of the four flip-flops are operating at a frequency $f_o/4$, the power consumption can be reduced compared to a case when two divide-by-two frequency dividers are serially connected. Also, the variable frequency divider 120 is operated as one frequency divider including four flip-flops, and thus the degradation of out-band phase noise can be prevented compared to when two divide-by-two frequency dividers are serially connected.

Figure 5:
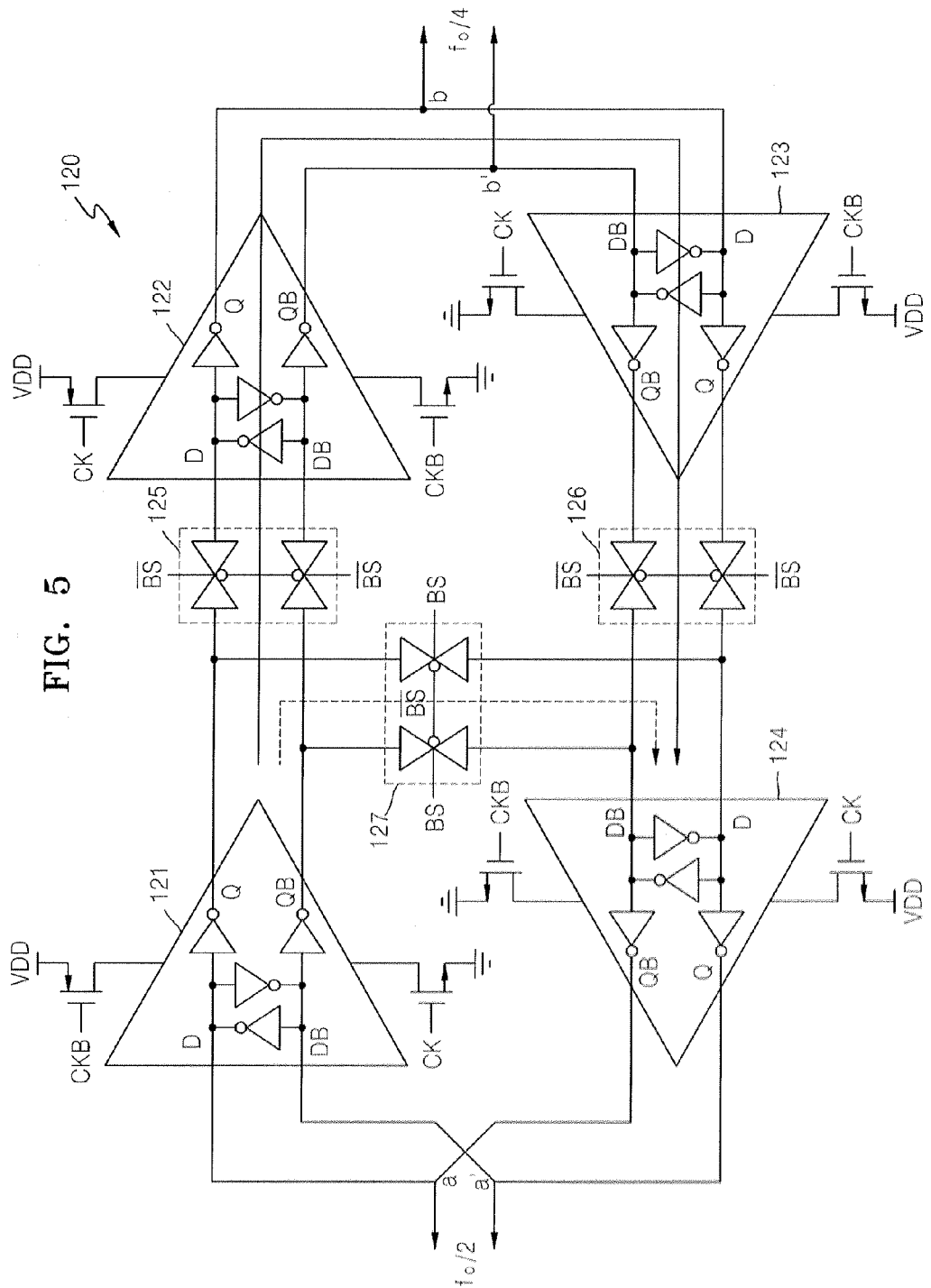
FIG. 5 is a detailed circuit diagram of the variable frequency divider illustrated in FIG. 4.

FIG. 5 is a detailed circuit diagram of the variable frequency divider 120 illustrated in FIG. 4. Referring to FIG. 5, the variable frequency divider 120 may include a plurality of flip-flops 121, 122, 123, and 124, and at least one switch unit; that is, the variable frequency divider 120 includes four flip-flops 121, 122, 123, 124, and three switch units 125, 126 and 127 as illustrated in FIG. 4.

The first through fourth flip-flops 121, 122, 123, and 124 respectively latch signals input through input ends D and inversed input ends DB based on clock signals CK or inversed clock signals CKB and output the latched signals. As illustrated in FIG. 5, the first through fourth flip-flops 121, 122, 123, and 124 may respectively each include a latch and at least one inverter. Also, when the variable frequency divider 120 frequency-divides an oscillation signal $f_o$ which is the output of the PLL 110, clock signals CK and inverted clocks signals CKB provided to each of the first through fourth flip-flops 121, 122, 123, and 124 may be the oscillation signal $f_o$ and an inversed signal of the oscillation signal $f_o$.

The control signal generating unit 150 illustrated in FIG. 3 generates a control signal BS and/or an inversed control signal $\overline{BS}$ and provides them to the variable frequency divider 120, and the first through third switch units 125, 126, and 127 are switched by the control signal BS and/or the inversed control signal $\overline{BS}$. For example, when the control signal BS is at a low level and the inversed control signal $\overline{BS}$ is at a high level, the first switch unit 125 and the second switch unit 126 are turned on and the third switch unit 127 is turned off. That is, the switches in the switch units 125 and 126 are closed to allow signal flow, and the switches in the switch unit 127 are open, such that a signal cannot flow through the switch unit 127. Thus, a signal transfer path from flip-flops 121 to 122 to 123 to 124, according to the direction of the solid line with the arrowhead, as illustrated in FIG. 5, is formed. Accordingly, all of the first through fourth flip-flops 121, 122, 123, and 124 in the variable frequency divider 120 are activated, and a divided-by-four signal $f_o/4$ is output through the node b, b'.

Meanwhile, when the control signal BS is at a high level and the inversed control signal $\overline{BS}$ is at a low level, the third switch unit 127 is turned on and the first switch unit 125 and the second switch unit 126 are turned off, and thus, a signal transfer path from flip-flop 121 to flip-flop 124, according to the direction of the dotted line with the arrowhead, as illustrated in FIG. 5, is formed. Accordingly, only the first flip-flop 121 and the fourth flip-flop 124 are activated among the first through fourth flip-flops 121, 122, 123, and 124, and also, a divided-by-two signal $f_o/2$ is output through the node a, a'.

Figure 6:
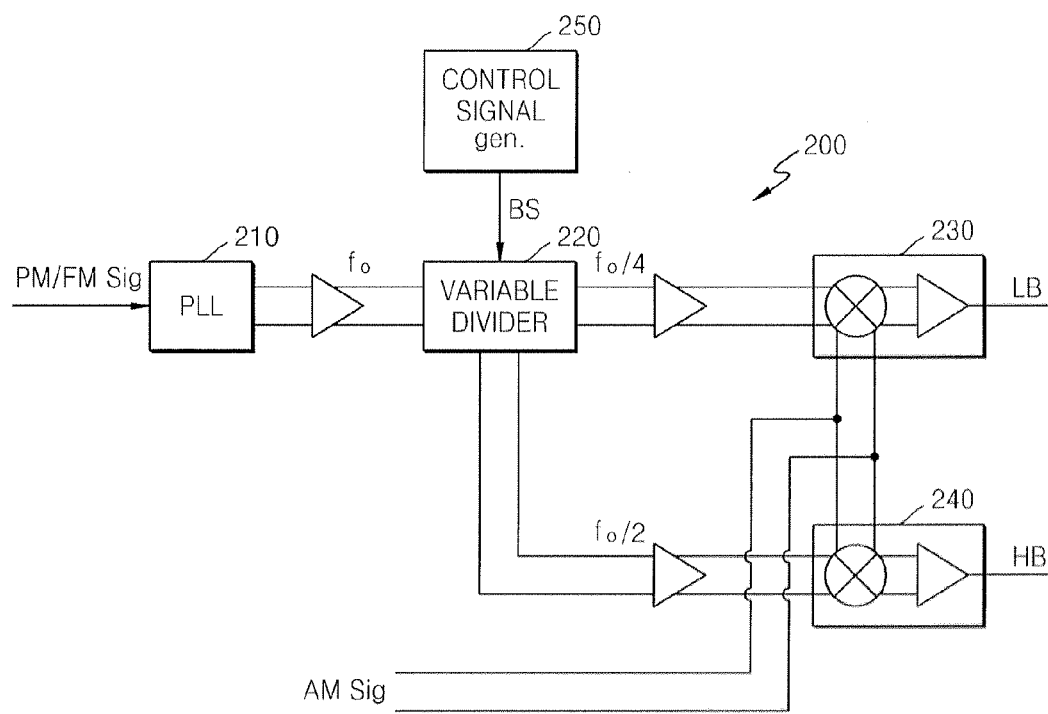
FIG. 6 is a block diagram illustrating an RF circuit according to another embodiment of the present general inventive concept.

FIG. 6 is a block diagram illustrating an RF circuit 200 according to another embodiment of the present general inventive concept. Referring to FIG. 6, the RF circuit 200 includes a polar transmitter architecture which includes an additional transmission path to transmit an amplitude-modulated signal AM Sig.

The PLL 210 receives a phase-modulated and/or amplitude-modulated baseband signal PM/FM Sig, and generates an oscillation signal $f_o$, which may be a high frequency oscillation signal, and outputs the oscillation signal $f_o$. A variable frequency divider 220 receives the oscillation signal $f_o$ as an input signal and divides the oscillation signal $f_o$ and outputs the frequency-divided oscillation signal $f_o$. Like the variable frequency divider 120 illustrated in FIG. 3, the variable frequency divider 220 of FIG. 6 also divides the frequency of an input signal $f_o$ by different multiples according to the status of a control signal BS generated in a control signal generating unit 250 and outputs the frequency-divided oscillation signal $f_o$. For example, the variable frequency divider 220 may include four flip-flops and three switch units; all of the four flip-flops may be activated or only some of them may be activated according to the status of the control signal BS.

Meanwhile, as illustrated in FIG. 6, the RF circuit 200 having a polar transmitter architecture may further include a transmission path to transmit the amplitude-modulated baseband signal AM Sig. A first drive circuit 230 may receive a divided-by-four signal $f_o/4$ and mix the divided-by-four signal $f_o/4$ with the amplitude-modulated signal AM Sig to generate a low band signal LB. Also, a second drive circuit 240 receives a divided-by-two signal $f_o/2$ and mixes the divided-by-two signal $f_o/2$ with the amplitude-modulated signal AM Sig to generate a high band signal HB. The above-described structure is advantageous in terms of a reduction in the chip size and power consumption compared to a direct-up conversion structure which is frequently used in standards such as enhanced data rate for GSM evolution (EDGE), code division multiple access (CDMA), etc., involving phase-modulated signals or amplitude-modulated signals.

Figure 7:
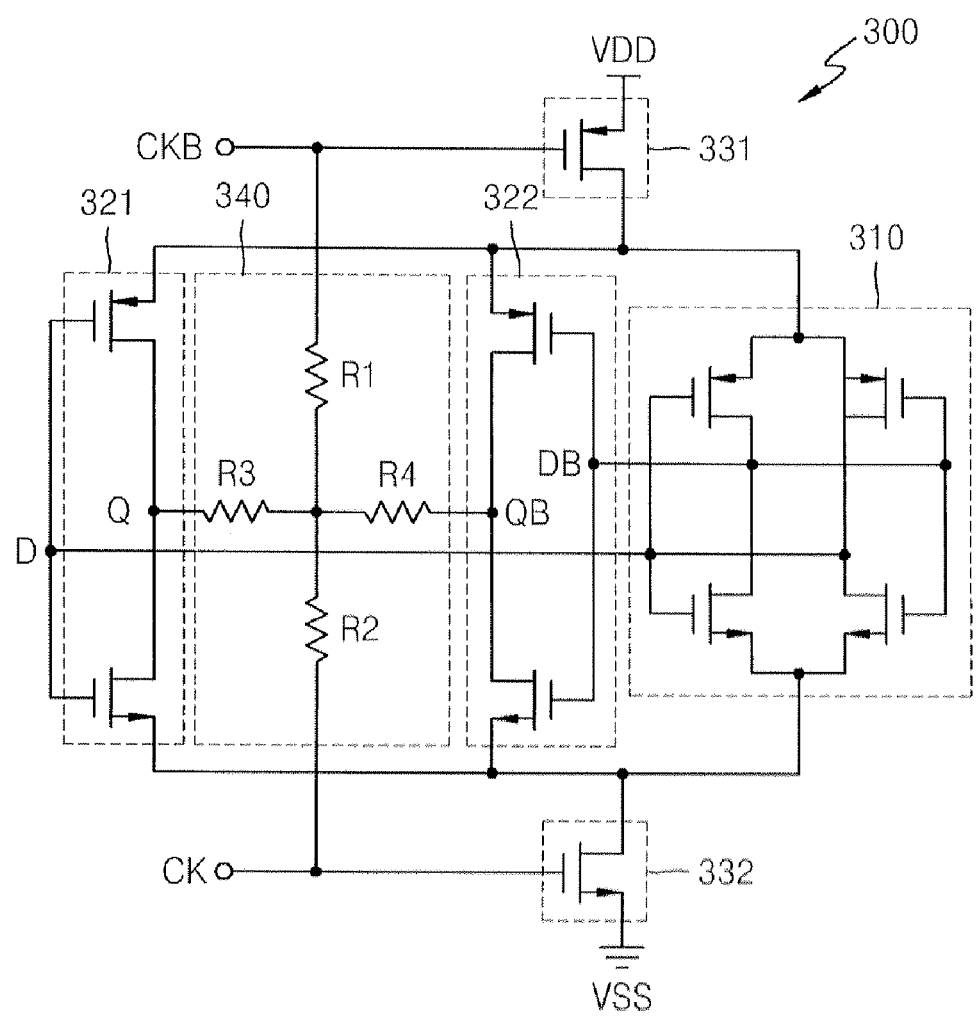
FIG. 7 is a circuit diagram illustrating a flip-flop that may be included in the variable frequency divider illustrated in FIG. 3.

FIG. 7 is a circuit diagram illustrating a flip-flop 300 that may be included in the variable frequency divider 120 illustrated in FIG. 3. As described above, the flip-flops included in the variable frequency divider 120 may respectively each include a latch 310, for example, and at least one inverter such as 321. The flip-flop 300 of FIG. 7 has an improved structure in that input signals are latched using the latch 310 and an output Q or QB, for example, of the at least one inverter is output to the outside as an output of the flip-flop 300. The above-described structure has advantages in terms of reducing power consumption and phase noise, and thus the flip-flop 300 may preferably be applied to the variable frequency divider 120.

As illustrated in FIG. 7, the flip-flop 300 includes a latch unit 310 that receives an input signal D and/or an inversed input signal DB and latches them and at least one inverter that receives the output of the latch unit 310 to invert and output the same. For example, the latch unit 310 may latch the input signal D and the inversed input signal DB to output them to at least one inverter, and the at least one inverter may include a first inverter 321 that receives the input signal D latched by the latch unit 310 and a second inverter 322 that receives the inversed input signal DB. The output of the first inverter 321 and the output of the second inverter 322 may respectively be provided to the outside as an output signal Q and an inversed output signal QB of the flip-flop 300.

Meanwhile, in order to operate the latch unit 310 and the first inverter 321 and the second inverter 322, a power voltage VDD and a ground voltage VSS need to be provided to the latch unit 310 and the first and second inverters 321 and 322, and preferably, the power voltage VDD may be provided using an identical switch to the latch unit 310 or to the first and second inverters 321 and 322. Also, in the same manner, the ground voltage VSS may be provided to the latch unit 310 and the first and second inverters 321 and 322 using the identical switch. As illustrated in FIG. 7, a first switch 331 formed of a PMOS transistor responds to an inversed clock signal CKB to provide the power voltage VDD to the latch unit 310 and the first and second inverters 321 and 322. Also, a second switch 332 responds to a clock signal CK so that the ground voltage VSS is provided to the latch unit 310 and the first and second inverters 321 and 322. When the flip-flop 300 is applied in a frequency divider, the clock signal CK may be an oscillation signal $f_o$ generated in a PLL, and the inversed clock signal CKB may be an inversed signal of the oscillation signal $f_o$.

Meanwhile, the flip-flop 300 may further include a resistor unit 340 that is connected to the output ends of the first and second inverters 321 and 322 to provide a predetermined bias voltage to the output ends of the first and second inverters 321 and 322. The resistor unit 340 may include at least one resistor; preferably, the resistor unit 340 may include at least two resistors such as resistors R1 and R2 that are serially connected between the inversed clock signal CKB input to the first switch 331 and the clock signal CK input to the second switch 332. Also, the resistor unit 340 may further include at least two resistors, for example, resistor R3 and resistor R4 that are serially connected between the output end of the first inverter 321 and an output end of the second inverter 322. Also, preferably, a node between the resistors R1 and R2 is the same as the node between the resistors R3 and R4.

In the case of the flip-flop 300 illustrated in FIG. 7, the outputs of the first and second inverters 321 and 322 are the outputs of the flip-flop 300. An inverter has a high voltage gain in a signal transition section. Accordingly, the input signal D and the inversed input signal DB latched by the latch unit 310 are output through the first and second inverters 321 and 322, and thus the flip-flop 300 may generate square waves having fast rising/falling times as output signals.

Meanwhile, in the flip-flop 300, an identical switch is commonly used to supply a power voltage VDD to the latch unit 310 and the first and second inverters 321 and 322. Further, an identical switch is commonly used to supply a ground voltage VSS to the latch unit 310 and the first and second inverters 321 and 322. And, the number of switches required to realize a flip-flop can be reduced thereby, and power consumption in the switch can also be reduced. When a frequency divider is formed using the flip-flop 300, power is usually consumed in a transition section of an output signal of the flip-flop 300, and thus a frequency divider with low power consumption can be realized.

Also, since the flip-flop 300 has a self-biased configuration by including resistors in the resistor unit 340, no additional bias circuit is required. Also, the flip-flop 300 can maintain its operation with respect to a small clock signal CK. In particular, when a power voltage VDD varies, the flip-flop 300 is automatically biased to a level corresponding to VDD/2, a square wave with a 50% duty cycle and an exact symmetry in upward and downward directions can be maintained. When a frequency divider is formed using the flip-flop 300 having the above-described characteristics, power consumption can be reduced with low phase noise, and a maximum output power at operational frequencies can be obtained.

Figure 8:
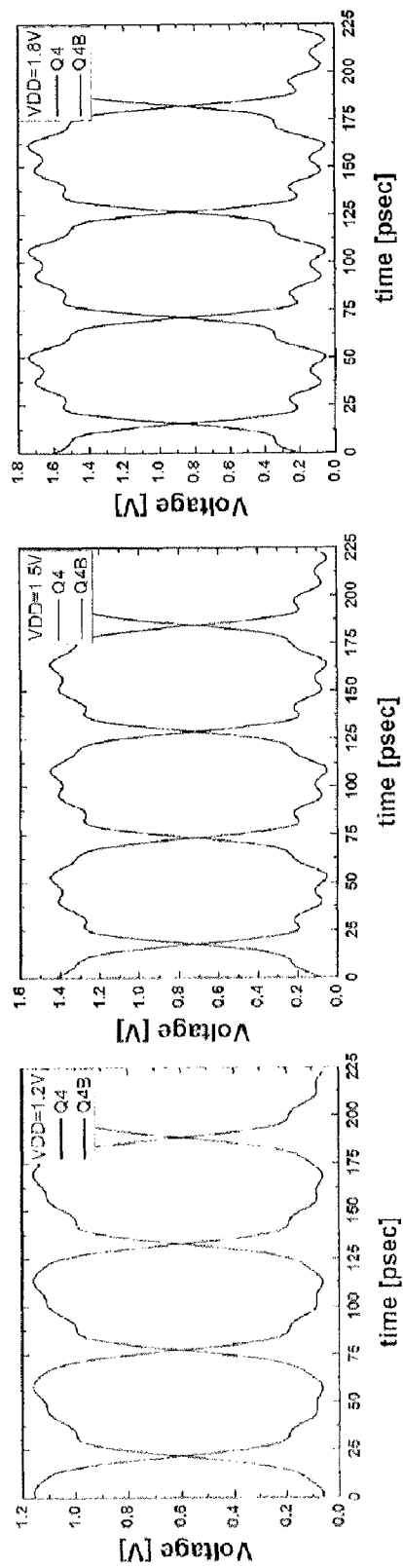
FIG. 8 illustrates waveforms of output signals of the flip-flop of FIG. 7.

FIG. 8 illustrates waveforms of output signals of the flip-flop 300 of FIG. 7. Referring to FIG. 8, the waveforms of the output signals in the case where power voltages VDD vary to 1.2V, 1.5V, and 1.8V are illustrated. The waveforms of the output signals maintains a square wave overall, and a duty cycle of almost 50% can be maintained even when the levels of the power voltages VDD vary.

As described above, according to the present general inventive concept, an RF circuit is formed using one frequency divider that generates differently frequency-divided signals according to operational bands, and thus the chip size and power consumption can be reduced and the out-band phase noise can be efficiently reduced at the same time.

While the present general inventive concept has been particularly illustrated and described with reference to exemplary embodiments thereof, it will be understood that various changes in form and details may be made therein without departing from the spirit and scope of the following claims.

What is claimed is:

1. A flip-flop applied in a frequency divider comprising:
   a latch unit latching an input signal;
   at least one inverter receiving and inverting an output of the latch unit;
   a switch unit switching a voltage signal provided to the latch unit and the at least one inverter; and
   a resistor unit connected to an output end of the at least one inverter and supplying a bias voltage to the output end of the at least one inverter.

2. The flip-flop of claim 1, wherein the switch unit comprises:
   a first switch unit supplying a power voltage to the latch unit and the at least one inverter; and
   a second switch unit grounding the latch unit and the at least one inverter with the ground voltage.

3. The flip-flop of claim 2, wherein the resistor unit comprises:
   a first resistor unit comprising a plurality of resistors that are serially connected between a first clock signal supplied to the first switch unit and a second clock signal supplied to the second switch unit; and
   a second resistor unit comprising a plurality of resistors that are serially connected between an output end of a first inverter and an output end of a second inverter, wherein the first and second inverters are included in the at least one inverter.

4. The flip-flop of claim 3, wherein the resistor unit supplies a bias voltage having half the amplitude of the power voltage to the output end of the first inverter and the output end of the second inverter.

* * * * *